United States Patent
Allwang et al.

(10) Patent No.: US 6,989,658 B2
(45) Date of Patent: Jan. 24, 2006

(54) CIRCUIT DESIGN FOR A CIRCUIT FOR SWITCHING CURRENTS

(75) Inventors: Reinhard Allwang, Schwandorf (DE); Volker Eichenseher, Beratzhausen (DE); Martin Götzenberger, Ingolstadt (DE); Dirk Hofmann, Regensburg (DE); Volker Karrer, Regensburg (DE)

(73) Assignee: Siemens Aktiengesellschaft, Munich (DE)

( * ) Notice: Subject to any disclaimer, the term of this patent is extended or adjusted under 35 U.S.C. 154(b) by 176 days.

(21) Appl. No.: 10/651,275

(22) Filed: Aug. 28, 2003

(65) Prior Publication Data

US 2004/0039999 A1    Feb. 26, 2004

Related U.S. Application Data

(63) Continuation of application No. PCT/DE02/00734, filed on Feb. 28, 2002.

(30) Foreign Application Priority Data

Feb. 28, 2001 (DE) ............................... 101 09 548

(51) Int. Cl.
*G05F 1/613* (2006.01)

(52) U.S. Cl. ...................... 323/225; 323/223
(58) Field of Classification Search .......... 323/220, 323/222, 223, 225, 233, 265, 268, 269, 271, 323/272, 980; 363/147; 307/112, 113, 125–131, 307/147, 148
See application file for complete search history.

(56) References Cited

U.S. PATENT DOCUMENTS

| | | | | |
|---|---|---|---|---|
| 3,213,300 A | | 10/1965 | Davis ........................ | 307/147 |
| 4,737,659 A | * | 4/1988 | Fognini ...................... | 307/112 |
| 4,809,153 A | | 2/1989 | Bremer et al. .............. | 363/141 |
| 5,446,366 A | * | 8/1995 | Bassett et al. .............. | 323/222 |
| 5,572,003 A | | 11/1996 | Kaneko ................... | 219/69.13 |
| 6,504,841 B1 | * | 1/2003 | Larson et al. ............... | 370/386 |
| 6,522,108 B2 | * | 2/2003 | Prager et al. ............... | 323/222 |

FOREIGN PATENT DOCUMENTS

| | | |
|---|---|---|
| DE | 43 38 277 A1 | 1/1995 |
| EP | 0 527 033 A2 | 8/1992 |
| EP | 0 553 981 A2 | 1/1993 |
| EP | 0 649 215 A1 | 10/1994 |

* cited by examiner

*Primary Examiner*—Matthew V. Nguyen
(74) *Attorney, Agent, or Firm*—Baker Botts L.L.P.

(57) ABSTRACT

A circuit design for a circuit for switching currents is disclosed, comprising at least one switch element (T1 ... Tn, T1' ... Tn'), and at least one respective main current conductor (D, S, A) for interlinking the switch element, the poles (V+, GND) of a current source and an energy accumulator (C). The aim of the invention is to reduce ohmic resistance and inductive resistance of such a circuit. To this end, an ancillary current conductor (D1, S1, A1) that has a lower current carrying capacity than the main current conductor is connected in parallel to at least one of the main current conductors (D, S, A).

9 Claims, 2 Drawing Sheets

CIRCUIT DESIGN FOR A CIRCUIT FOR SWITCHING CURRENTS

CROSS REFERENCE TO RELATED APPLICATION

This application is a continuation of copending International Application No. PCT/DE02/00734 filed Feb. 28, 2002, which designates the United States, and claims priority to German application number 10109548.1 filed Feb. 28, 2001.

TECHNICAL FIELD OF THE INVENTION

The invention relates to a circuit design for a circuit for switching currents, in particular a converter as a DC/DC converter or inverter for alternating current or three-phase current.

BACKGROUND OF THE INVENTION

The circuit design for switching high currents—for example in the case of an converter—where space is at a premium, whilst keeping costs low and allowing mass production, is particularly critical. To this end, an arrangement of discrete power semiconductor devices (switching transistors) with current leads having a high current-carrying capacity and cooling of the power semiconductor devices, for example by means of a water cooling system, is required.

With regard to fast switching of the power semiconductor devices, this depends on a low-resistance and low-inductance connection of the components. However, this is only possible in the case of simple arrangements of DC link capacitors and power semiconductor devices. If additional components such as gate resistors are required, a low-inductance linkage of the power semiconductor devices to the DC link capacitors can no longer be guaranteed in all cases because the current-carrying copper surfaces are "cut" by the resistors and thus their resistance and inductance are increased.

As leakage inductances become greater, the overvoltage occurring at the power semiconductor devices increases. At the same time, the energy stored in the leakage inductances is converted into heat. The greater the currents to be switched, the greater this heat becomes because the energy increases with the square of the current. In the case of high currents, the leakage inductances must therefore be minimized since the power semiconductor devices could otherwise be destroyed. This also applies, however, appropriately scaled, to other circuits in which low currents are flowing.

SUMMARY OF THE INVENTION

The object of the invention is to create a circuit design for switching currents which can be used where space is at a premium and can be mass-produced at low cost levels, and permit both a low-inductance and also a low-resistance connection of the power semiconductor devices to a DC link, and a low-resistance connection to one or more DC link capacitors.

This object can be achieved by a circuit design for a circuit for switching currents, comprising at least one switch element, each comprising a main current conductor for interconnecting the switch element, the poles of a current source, an energy accumulator and a load, wherein a further ancillary current conductor having a lower current-carrying capacity than the main current conductor is connected in parallel in each case to each main current conductor comprising a high current-carrying capacity arranged at least between the switch elements or between the poles of the current source and the switch elements or the energy accumulator.

The circuit design may further comprise a half-bridge circuit located at the poles of a DC source consisting of at least one or a predefined number of series circuits connected in parallel to one another, each consisting of one high-side switch and one low-side switch, whose interconnected connection points form the output carrying the alternating current, wherein the drain terminals of all high-side switches are connected to one another and to the one terminal of at least one DC link capacitor by way of a first main current conductor, to which a first ancillary current conductor having a lower current-carrying capacity than the main current conductor is connected in parallel. The source terminals of all low-side switches may be connected to one another, to the other terminal of the at least one DC link capacitor and to one terminal of the load by way of a second main current conductor, to which a second ancillary current conductor having a lower current-carrying capacity than the main current conductor is connected in parallel. The interconnected source terminals of all high-side switches and drain terminals of all low-side switches may be connected to one another and to the other terminal of the load by way of a third main current conductor, to which a third ancillary current conductor having a lower current carrying capacity than the main current conductor is connected in parallel. The gate terminals of all high-side switches can be connected to one another by way of a first control current conductor. The gate terminals of all low-side switches can be connected to one another by way of a second control current conductor. The main current conductors, the ancillary current conductors and the control current conductors can be arranged above one another in four layers electrically insulated from one another, whereby one main current conductor is located in the first layer, a thick layer. The ancillary current conductor associated with this main current conductor and the control current conductors can be located in the second layer, a thin layer. The two other main current conductors can be located in the fourth layer, a thick layer, and the ancillary current conductors associated with the main current conductors located in the fourth layer can be located in the third layer, a thin layer. The high-side switches and the low-side switches may form a row in each case, whereby the two rows are located opposite one another such that the interconnected terminals of these switches are arranged in two rows, intermeshed in one another, whereby the terminals of the switches are bent such that the outer terminals in each case are bent away at a short distance from the semiconductor housing and the center terminal is bent away at a greater distance from the semiconductor housing. The high-side switches and the low-side switches may form a row in each case, whereby the two rows are located opposite one another such that the interconnected terminals of these switches, which are all bent away from the semiconductor housing at the same short distance, are located opposite one another.

When using "thick" current conductors having a high current-carrying capacity (designed for the amperage of the load current), referred to as main current conductors, which have a low resistance but a higher inductance, according to the invention a further, "thin" current conductor, referred to as an ancillary current conductor, which has a lower current-carrying capacity than the main current conductor and which has a low inductance but a higher resistance, is connected in parallel to at least one of these main current conductors.

The two objectives, namely "low resistance" and "low inductance", are achieved separately. In this situation, at the moment of switching the connection with higher resistance but low inductance is effective in the first instance and then after a delay the low resistance, higher inductance connection becomes effective.

This measure serves to reduce the inductance and ohmic resistance of the current conductor arrangement (main and ancillary current conductors connected in parallel), a shortening of the transient switch-off operation of the power semiconductor devices is achieved, and the energy converted in the power semiconductor devices during the switch-off operation is also less—the power loss is reduced—and the heat is better distributed throughout the entire switching cycle.

BRIEF DESCRIPTION OF THE DRAWINGS

Two exemplary embodiments of the invention will be described in detail in the following with reference to schematic drawings. In the drawings.

DETAILED DESCRIPTION OF THE PREFERRED EMBODIMENTS

Where the following refers to a current conductor, this can be a conducting wire, a printed circuit board, a leadframe, a bus bar or similar. With regard to the following exemplary embodiments, for the sake of simplicity the current conductors should take the form of already known printed circuit boards (current-conducting layers applied to an electrically insulating substrate material) for example.

Figure 1:
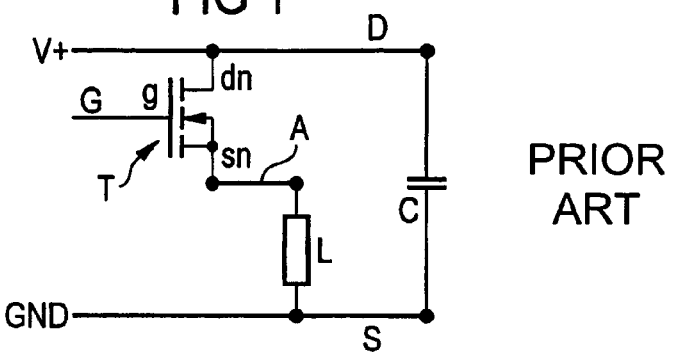
FIG. 1 shows a known circuit for controlling a load by means of a switch element.

FIG. 1 shows a known circuit for controlling a load L which is applied in series with a switch element T, normally a power semiconductor device taking the form of a bipolar transistor or MOSFET, to the poles V+ and GND of an energy source. If the switch element is switched in quick succession, a DC link capacitor C connected in parallel with the series circuit comprising switch element T and load L is required.

The current conductors by means of which the elements T, L and C are interconnected and connected to the energy source are denoted by D, A, S and G. The gate terminal g receives its control signal for turning the switch element T on and off by way of the current conductor G.

Figure 2:
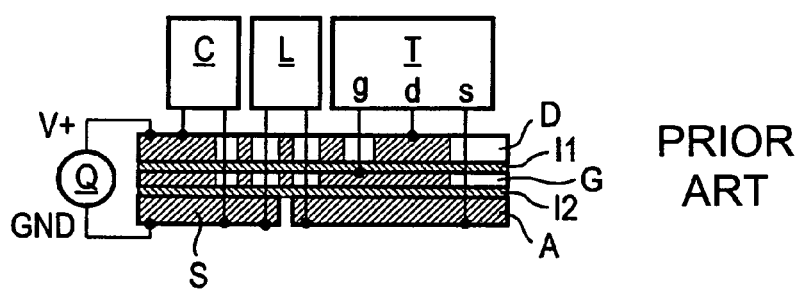
FIG. 2 shows a known circuit design for this purpose.

FIG. 2 shows a known circuit design for the circuit according to FIG. 1 on a multi-layer printed circuit board shown in cross-section. The printed circuit board consists of two thick outer layers, an upper outer layer D and a lower outer layer on which are arranged two main current conductors S and A which are separated electrically from one another. Between these is located a thin inner layer G which is separated electrically from the outer layers by means of non-conducting insulating plates I1 and I2.

Multiply connected electrically conducting surfaces are shown as hatched and with a thick border. They are interrupted where necessary by non-hatched holes for the passage for connecting wires. Larger electrically non-conducting surfaces are likewise not hatched. The multi-layer printed circuit board is not shown to scale. The layer thicknesses could be: D, S, A=400 $\mu$m, G=35 $\mu$m and I1, I2=1 mm, for example. The thin inner layer G is used here exclusively for delivering the control signal to the gate terminal g of the switch element T.

Figure 3:
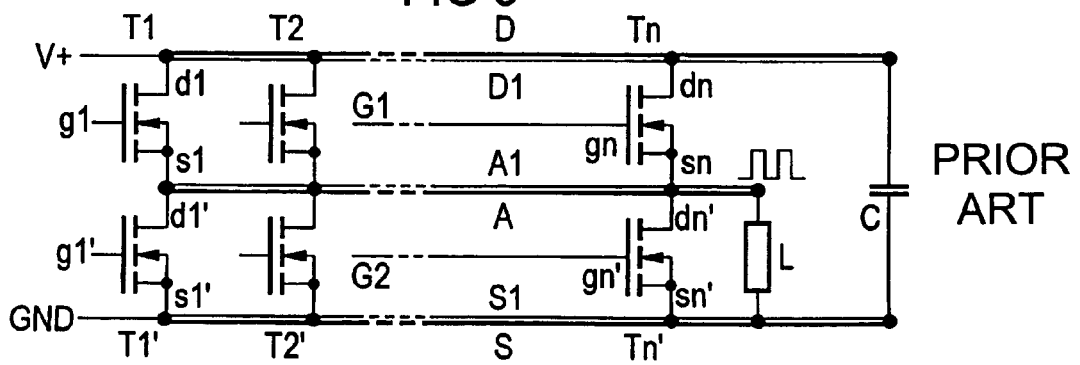
FIG. 3 shows a known circuit for a converter.

FIG. 3 shows a partial circuit diagram of a known converter, for example in an integrated starter/generator (ISG) for a motor vehicle, namely one phase of an inverter for generating three-phase alternating current from direct current. This circuit can also operate as a DC/DC converter, for example.

The circuit comprises a half-bridge consisting of power switches, namely the series circuit of a high-side switch T1 and a low-side switch T1', which is applied to the poles V+ and GND of an energy source. Further such series circuits T2–T2' . . . Tn–Tn' are connected in parallel to this half-bridge for switching high amperages.

The drain terminals d1 to dn of all high-side switches T1 to Tn are connected to one another and to the positive pole V+ of the energy source by way of a first main current conductor D;

the source terminals s1' to sn' of all low-side switches T1' to Tn' are connected to one another and to the negative pole GND of the energy source by way of a second main current conductor S;

the interconnected source terminals s1 to sn of all high-side switches T1 to Tn and drain terminals d1' to dn' of all low-side switches T1' to Tn' are connected to one another by way of a third main current conductor A;

the gate terminals g1 to gn of all high-side switches T1 to Tn are connected to one another by way of a first further current conductor G1, called the control current conductor;

the gate terminals g1' to gn' of all low-side switches T1' to Tn' are connected to one another by way of a second control current conductor G2;

at least one DC link capacitor C is arranged between the main current conductors D and S; and the load is located between the main current conductors A and S.

If the high-side switches T1 to Tn are made conducting in alternation with the low-side switches T1' to Tn', then from the DC voltage which is present between the first and the second main current conductors D and S an AC voltage is produced which can be picked off between the third and second main current conductors A and S.

If three such phase circuits are used and controlled appropriately, then three-phase direct current/voltage can be picked off at their three outputs.

Figure 4A:
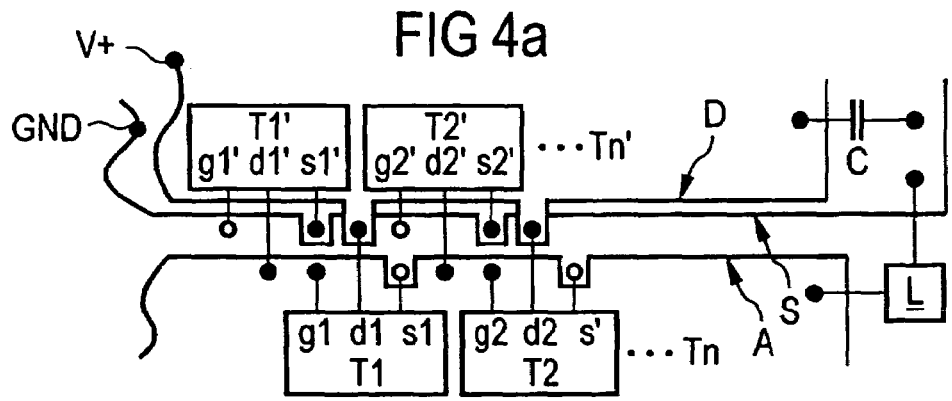
FIG. 4a shows a first exemplary embodiment of a circuit design for the converter according to FIG. 3.
Figure 4B:
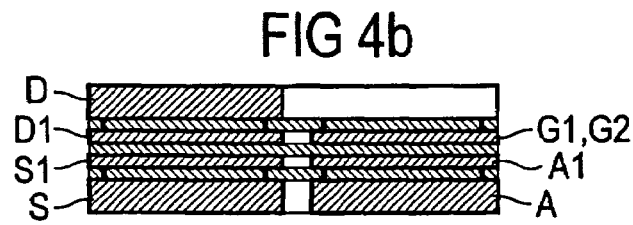
FIG. 4b shows a cross-section through the associated printed circuit board.

The circuit according to FIG. 3 is constructed in accordance with a first exemplary embodiment on a multi-layer printed circuit board which is illustrated schematically in FIG. 4b in cross-section and in a top view in FIG. 4a together with the components arranged on it.

The multi-layer printed circuit board in accordance with FIG. 4b comprises four electrically conducting layers insulated from one another, made of copper for example, whereby the first (uppermost) layer, which carries the first main current conductor D, and the fourth (lowermost) layer, on which the second and third main current conductors S and A are located, receive the load current in each case and therefore exhibit an adequate layer thickness, 400 μm for example. The second and third layers exhibit a layer thickness of 35 μm for example. This will be discussed in further detail below.

FIG. 4a shows a top view of the three main current conductors A, D and S arranged on the first and fourth layers without the second and third layers and without the interposed insulating layers, together with the components arranged thereon, —the high-side and low-side switches T1 to Tn, T1' to Tn', a DC link capacitor C and the load L.

The high-side switches T1 . . . Tn and the low-side switches T1' . . . Tn' form a row in each case, whereby the two rows are located opposite one another such that the terminals of the power switches are arranged in two rows, intermeshed in one another, and that their interconnected terminals s1-d1' . . . sn-dn' are located alongside one another.

To this end, the terminals of the high-side and low-side switches are bent such that the outer terminals in each case (source terminal s and gate terminal g) are bent away at a short distance from the semiconductor housing and the center terminal (drain terminal d) is bent away at a greater distance from the semiconductor housing such that the housings can be arranged to lie flat on the multi-layer printed circuit board.

Having the same dimensions as the first main current conductor D in the first layer (400 μm) and arranged precisely beneath it in the second layer (35 μm) is a first ancillary current conductor D1, whereby by means of the through-contacts of the terminals of the components, connected to the first main current conductor D, to the first ancillary current conductor D1 both current conductors D and D1 are connected in parallel to one another.

A second and a third ancillary current conductor S1 and A1 are similarly arranged above the two main current conductors S and A arranged in the fourth layer (400 μm) and precisely above them in the third layer (35 μm), whereby the current conductors S with S1 and A with A1 are connected in parallel to one another by means of the through-contacts of the terminals of the components connected to the second and third main current conductors S and A respectively.

These parallel circuits comprising in each case one "thick" main and one "thin" ancillary current conductor D–D1, S–S1 and A–A1 are indicated in FIG. 3 by means of thick and thin parallel lines representing the current conductors and can also be seen from FIG. 4b.

In this first exemplary embodiment the parallel current conductors D–D1 are arranged above the parallel current conductors S–S1.

As a result of these measures, the inductance and ohmic resistance of the current conductor arrangements D–D1, S–S1 and A–A1 taking the form of printed circuit boards in this exemplary embodiment, including to one or more DC link capacitors C and to the load L, are reduced, as already explained further above.

The first and second control current conductors G1 and G2 which connect the gate terminals of the high-side switches and the low-side switches to control circuits that are not shown and which are not shown in FIG. 4a are arranged on the part of the second, thin layer which is not occupied by the first ancillary current conductor D1. For these control signals only thin current conductors are required which can also be routed through between the terminals of the power switches (in contrast to the main current conductors D, S and A carrying high currents).

The control current conductors G1 and G2 could, however, also be arranged on the first, thick layer insofar as this is not occupied by the main current conductor D, or be distributed on this and the second, thin layer located beneath it.

In a second exemplary embodiment, a multi-layer printed circuit board is likewise used which corresponds in its structure to the printed circuit board according to FIG. 4b, except that it has a different distribution. The high-side switches and low-side switches are once again located opposite one another, but their terminals are not arranged to be intermeshed with one another. As a result of this arrangement, the connection to the DC link capacitors becomes more low-inductive, and is thus further improved.

Figure 5A:
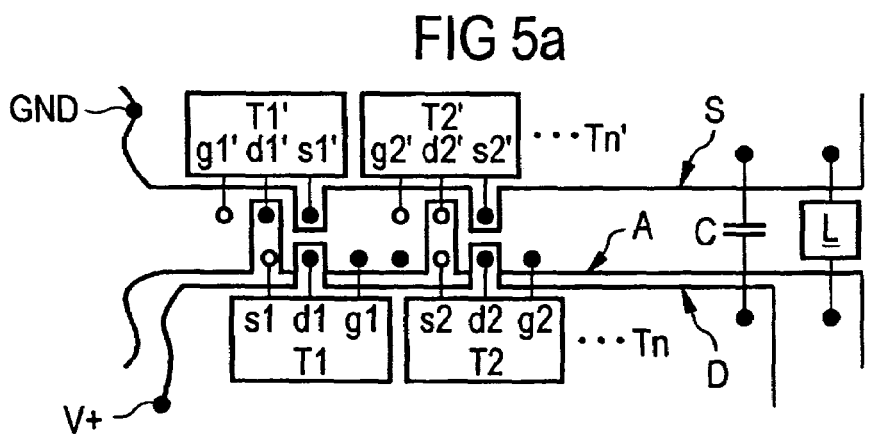
FIG. 5a shows a second exemplary embodiment of a circuit design for the converter according to FIG. 3.
Figure 5B:
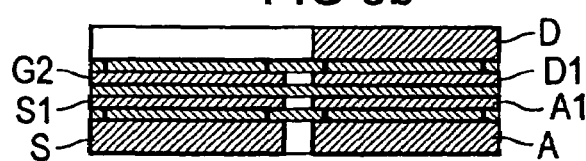
FIG. 5b shows a cross-section through the associated printed circuit board.

The multi-layer printed circuit board is shown schematically in cross-section in FIG. 5b and is shown in a top view in FIG 5a together with the components arranged on it.

The multi-layer printed circuit board in accordance with FIG. 5b once again comprises four electrically conducting layers insulated from one another, made of copper for example, whereby the first (uppermost) layer, which represents the first main current conductor D, and the fourth (lowermost) layer, on which the second and third main current conductors S and A are located, receive the load current in each case and therefore exhibit an adequate layer thickness, 400 μm for example. The second and third layers exhibit a layer thickness of 35 μm for example.

In this second exemplary embodiment, the current conductors D–D1 which are connected in parallel are arranged above the current conductors A–A1 which are connected in parallel.

FIG. 5a shows a top view of the main current conductors A, D and S arranged on the first and fourth layers without the second and third layers and without the interposed insulating layers, together with the components arranged thereon, —the high-side and low-side switches T1 . . . Tn, T1' . . . Tn', a DC link capacitor C and the load L.

The high-side switches T1 . . . Tn and the low-side switches T1' . . . Tn' form a row in each case, whereby the two rows, not intermeshed in one another as in the case of the exemplary embodiment according to FIG. 4a, are located opposite one another such that the interconnected terminals s1-d1' . . . sn-dn' of the power switches are arranged to be located opposite one another. To this end, all the terminals of the high-side and low-side switches are bent away at the same short distance from the semiconductor housing, whereby the housings can be arranged to lie flat on the multi-layer printed circuit board.

Having the same dimensions as the first main current conductor D in the first layer (400 μm) and arranged precisely beneath it in the second layer (35 μm) is a first ancillary current conductor D1, whereby by means of the through-contacts of the terminals of the components, connected to the first main current conductor D, to the first ancillary current conductor D1 both current conductors D and D1 are connected in parallel to one another.

A second and a third ancillary current conductor S1 and A1 are similarly arranged above the two main current conductors S and A arranged in the fourth layer (400 μm) and precisely above them in the third layer (35 μm), whereby current conductors S with S1 and D with D1 are connected in parallel to one another by means of the through-contacts of the terminals of the components connected to the main current conductors S and A respectively.

The same also applies here to the control current conductors G1 and G2 as has already been stated with regard to the first exemplary embodiment.

What is claimed is:

1. Circuit design for a circuit for switching currents, comprising at least one switch element, each comprising a main current conductor for interconnecting the switch element, the poles of a current source, an energy accumulator and a load, wherein a further ancillary current conductor having a lower current-carrying capacity than the main current conductor is connected in parallel in each case to each main current conductor comprising a high current-carrying capacity arranged at least between the switch elements or between the poles of the current source and the switch elements or the energy accumulator.

2. Circuit design according to claim 1, further comprising a half-bridge circuit located at the poles of a DC source consisting of at least one or a predefined number of series circuits connected in parallel to one another, each consisting of one high-side switch and one low-side switch, whose interconnected connection points form the output carrying the alternating current, wherein the drain terminals of all high-side switches are connected to one another and to the one terminal of at least one DC link capacitor by way of a first main current conductor, to which a first ancillary current conductor having a lower current-carrying capacity than the main current conductor is connected in parallel.

3. Circuit design according to claim 2, wherein the source terminals of all low-side switches are connected to one another, to the other terminal of the at least one DC link capacitor and to one terminal of the load by way of a second main current conductor, to which a second ancillary current conductor having a lower current-carrying capacity than the main current conductor is connected in parallel.

4. Circuit design according to claim 3, wherein the interconnected source terminals of all high-side switches and drain terminals of all low-side switches are connected to one another and to the other terminal of the load by way of a third main current conductor, to which a third ancillary current conductor having a lower current carrying capacity than the main current conductor is connected in parallel.

5. Circuit design according to claim 4, wherein the gate terminals of all high-side switches are connected to one another by way of a first control current conductor.

6. Circuit design according to claim 5, wherein the gate terminals of all low-side switches are connected to one another by way of a second control current conductor.

7. Circuit design according to claim 6, wherein the main current conductors, the ancillary current conductors and the control current conductors are arranged above one another in four layers electrically insulated from one another, whereby one main current conductor is located in the first layer, a thick layer;

the ancillary current conductor associated with this main current conductor and the control current conductors are located in the second layer, a thin layer;

the two other main current conductors are located in the fourth layer, a thick layer; and the ancillary current conductors associated with the main current conductors located in the fourth layer are located in the third layer, a thin layer.

8. Circuit design according to claim 6, wherein the high-side switches and the low-side switches form a row in each case, whereby the two rows are located opposite one another such that the interconnected terminals of these switches are arranged in two rows, intermeshed in one another, whereby the terminals of the switches are bent such that the outer terminals in each case are bent away at a short distance from the semiconductor housing and the center terminal is bent away at a greater distance from the semiconductor housing.

9. Circuit design according to claim 6, wherein the high-side switches and the low-side switches form a row in each case, whereby the two rows are located opposite one another such that the interconnected terminals of these switches, which are all bent away from the semiconductor housing at the same short distance, are located opposite one another.

* * * * *